United States Patent
Lee et al.

(10) Patent No.: US 10,608,156 B2
(45) Date of Patent: Mar. 31, 2020

(54) THERMOELECTRIC MODULE AND MANUFACTURING METHOD THEREOF

(71) Applicant: LG CHEM, LTD., Seoul (KR)

(72) Inventors: Dae-Ki Lee, Daejeon (KR); Dong-Sik Kim, Daejeon (KR); Ye-Rok Park, Daejeon (KR); Jae-Ki Lee, Daejeon (KR); Byung-Kyu Lim, Daejeon (KR); Hyun-Woo Choi, Daejeon (KR); Cheol-Hee Park, Daejeon (KR); Seung-Hyup Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 88 days.

(21) Appl. No.: 15/548,061

(22) PCT Filed: Jul. 21, 2016

(86) PCT No.: PCT/KR2016/007965
§ 371 (c)(1),
(2) Date: Aug. 1, 2017

(87) PCT Pub. No.: WO2017/014584
PCT Pub. Date: Jan. 26, 2017

(65) Prior Publication Data
US 2018/0033938 A1     Feb. 1, 2018

(30) Foreign Application Priority Data

Jul. 21, 2015   (KR) .................. 10-2015-0103223

(51) Int. Cl.
*H01L 35/28*     (2006.01)
*H01L 35/04*     (2006.01)
(Continued)

(52) U.S. Cl.
CPC .............. *H01L 35/04* (2013.01); *H01L 35/08* (2013.01); *H01L 35/14* (2013.01); *H01L 35/24* (2013.01);
(Continued)

(58) Field of Classification Search
CPC ... H01L 35/04; C22C 1/0491; B22F 2301/15; B22F 2301/30
(Continued)

(56) References Cited

U.S. PATENT DOCUMENTS 3,580,743 A * 5/1971 MacPhee ............... H01L 35/08
                                                136/212
9,005,330 B2   4/2015 Shearer et al.
(Continued)

FOREIGN PATENT DOCUMENTS

JP       2015-050273 A    3/2015
KR    10-2011-0016113 A   2/2011
(Continued)

OTHER PUBLICATIONS

Yoon, Sang Won et al. "Highly reliable nickel-tin transient liquid phase bonding technology for high temperature operational power electronics in electrified vehicles." 2012 Twenty-Seventh Annual IEEE Applied Power Electronics Conference and Exposition ( APEC) (2012): 478-482. (Year: 2012).*
(Continued)

*Primary Examiner* — Angelo Trivisonno

(57) ABSTRACT

The present disclosure discloses a thermoelectric module to which a bonding technique for stably driving the thermoelectric module at high temperatures is applied and a method of manufacturing the thermoelectric module. The thermoelectric module according to the present disclosure includes thermoelectric elements including a thermoelectric semiconductor, an electrode which includes a metal material and is
(Continued)

connected between the thermoelectric elements, and a bonding layer which is interposed between the thermoelectric element and the electrode to bond the thermoelectric element with the electrode and includes a metal compound including metals of two or more classes as a sintered body of a paste including metal powders of two or more classes.

13 Claims, 9 Drawing Sheets

(51) Int. Cl.
| | |
|---|---|
| *H01L 35/34* | (2006.01) |
| *H01L 35/24* | (2006.01) |
| *H01L 35/14* | (2006.01) |
| *H01L 35/08* | (2006.01) |
| *H01L 35/32* | (2006.01) |
| *H01L 35/18* | (2006.01) |

(52) U.S. Cl.
CPC .............. *H01L 35/32* (2013.01); *H01L 35/34* (2013.01); *H01L 35/18* (2013.01)

(58) Field of Classification Search
USPC ........................................................ 136/212
See application file for complete search history.

(56) References Cited

U.S. PATENT DOCUMENTS

| | | | |
|---|---|---|---|
| 2014/0042212 A1* | 2/2014 | Shearer | B23K 35/025 228/248.1 |
| 2014/0109948 A1* | 4/2014 | Lee | H01L 35/08 136/203 |
| 2016/0163944 A1* | 6/2016 | Fujimoto | H01L 35/08 136/205 |

FOREIGN PATENT DOCUMENTS

| | | |
|---|---|---|
| KR | 10-2013-0071531 A | 7/2013 |
| KR | 10-2014-0050390 A | 4/2014 |
| KR | 10-2015-0065670 A | 6/2015 |

OTHER PUBLICATIONS

International Search Report for International Patent Application No. PCT/KR2016/007965 filed on Jul. 21, 2016.

* cited by examiner

THERMOELECTRIC MODULE AND MANUFACTURING METHOD THEREOF

TECHNICAL FIELD

The present application is a U.S. National Stage of PCT/KR2016/007965 filed Jul. 21, 2016, which claims priority to Korean Patent Application No. 10-2015-0103223 filed on Jul. 21, 2015 in the Republic of Korea, the disclosures of which are incorporated herein by reference.

The present disclosure relates to a thermoelectric technique, and more particularly, to a thermoelectric module capable of being processed and driven at high temperatures and a method of manufacturing the thermoelectric module.

BACKGROUND ART

If there is a temperature difference between both ends of a solid material, a concentration difference of carriers (electrons or holes) having thermal dependence occurs, leading to an electric phenomenon called a thermal electromotive force, that is, a thermoelectric effect. As such, the thermoelectric effect means a reversible and direct energy conversion between a temperature difference and an electric voltage. The thermoelectric effect may be classified into thermoelectric power generation that produces electric energy and thermoelectric cooling/heating that causes a temperature difference between both ends by electricity supply.

A thermoelectric material showing the thermoelectric effect, that is, a thermoelectric semiconductor has been much studied due to its eco-friendliness and sustainability during power generation and cooling. Moreover, since the thermoelectric material is capable of directly producing power from industrial waste heat, vehicle waste heat, etc., and thus is useful for improving fuel efficiency or reducing $CO_2$, etc., the thermoelectric material has attracted more and more attention.

A thermoelectric module has, as a basic unit, one pair of p-n thermoelectric elements including a p-type thermoelectric element (TE) in which holes move to transfer thermal energy and an n-type TE in which electrons move to transfer thermal energy. The thermoelectric module may include an electrode that connects the p-type TE with the n-type TE.

For a conventional thermoelectric module, soldering has been widely used to bond an electrode with thermoelectric element. Conventionally, the electrode and the thermoelectric element are generally bonded using, for example, an Sn-based solder paste or a Pb-based solder paste.

However, such a solder paste has a limitation in driving a thermoelectric module in a high-temperature condition because of its low melting point. For example, a thermoelectric module using an Sn-based solder paste to bond a thermoelectric element and an electrode is difficult to drive at a temperature over 200° C. A thermoelectric module using an Pb-based solder paste is difficult to drive at a temperature over 300° C.

DISCLOSURE

Technical Problem

The present disclosure is designed to solve the problems of the related art, and therefore the present disclosure is directed to providing a thermoelectric module to which a bonding technique for stably driving the thermoelectric module at high temperatures is applied in comparison to a conventional bonding scheme such as soldering, etc., and a method of manufacturing the thermoelectric module.

Other objects and advantages of the present disclosure will be understood by the following description, and will become more apparent from embodiments of the present disclosure.

Technical Solution

In one aspect of the present disclosure, there is provided a thermoelectric module including a plurality of thermoelectric elements including a thermoelectric semiconductor, an electrode which includes a metal material and is connected between the thermoelectric elements, and a bonding layer which is interposed between the thermoelectric element and the electrode to bond the thermoelectric element with the electrode and includes a metal compound including metals of two or more classes as a sintered body of a paste including metal powders of two or more classes.

Herein, the metals of two or more classes may include a post-transition metal of one or more class and a transition metal of one or more class.

The metals of two or more classes may include Ni and Sn.

The bonding layer may further include one or more metal selected from among Fe, Cu, Al, Zn, Bi, Ag, Au, and Pt.

Ni and Sn may be included in the bonding layer at a ratio of (15–50):(85–50).

The bonding layer may be formed in such a way that a paste including the metal powders of two or more classes is sintered in a transient liquid phase sintering (TLPS) manner and the metal powders of two or more classes are transformed into the metal compound.

The thermoelectric element may include a skutterudite-based thermoelectric semiconductor.

The thermoelectric element according to the present disclosure may further include a metallized layer which includes metal, an alloy, or a metal compound and is interposed between the thermoelectric element and the bonding layer.

The metallized layer may be formed by stacking of two or more different layers.

The thermoelectric module may further include a NiP layer between the bonding layer and the electrode.

In another aspect of the present disclosure, there is provided a thermoelectric power-generation device including the thermoelectric module according to the present disclosure.

In another aspect of the present disclosure, there is provided a method of manufacturing a thermoelectric module, the method including providing a plurality of thermoelectric elements including a thermoelectric semiconductor and a plurality of electrodes including a metal material, interposing a paste including metal powders of two or more classes between the thermoelectric element and the electrode, and sintering the paste in a TLPS manner.

Advantageous Effects

A thermoelectric module according to the present disclosure may be driven stably at high temperatures. In particular, the thermoelectric module according to the present disclosure may be driven stably not only at a temperature of about 300° C., but also at a temperature of about 400° C. through about 500° C., and may be mostly driven in a temperature condition of about 800° C.

Thus, the thermoelectric module according to the present disclosure is more usefully applicable to a thermoelectric power-generation module.

Moreover, the thermoelectric module according to the present disclosure may have high bonding strength, for example, of about 10 MPa or higher.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

MODE FOR DISCLOSURE

Figure 1:
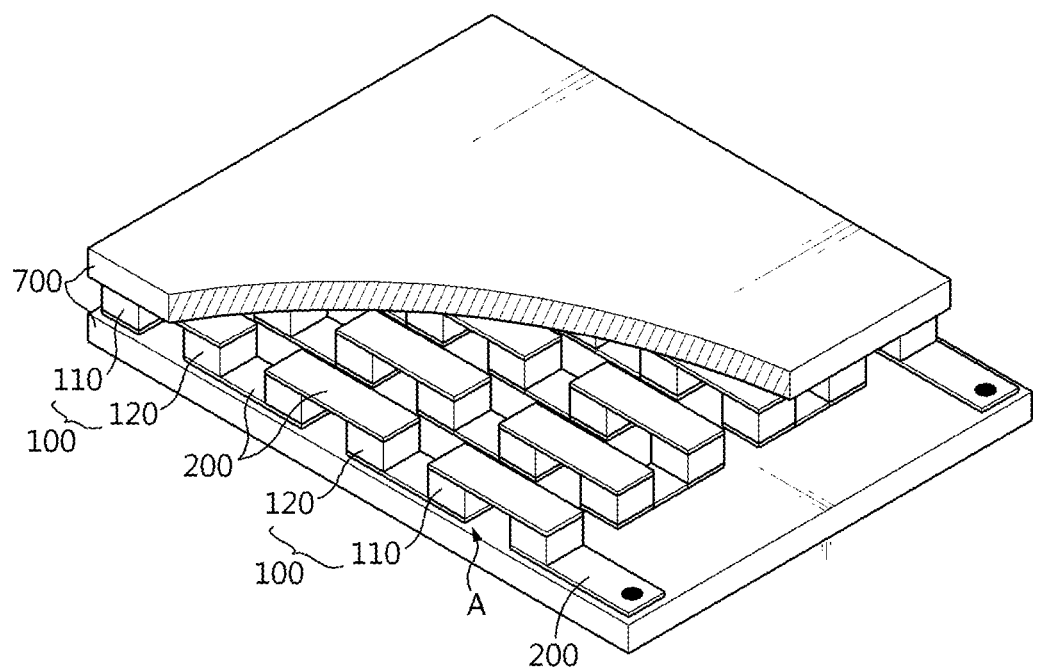
FIG. 1 schematically illustrates a thermoelectric module according to an embodiment of the present disclosure.

Hereinafter, embodiments will be described with reference to the accompanying drawings. The terms or words used in the description and claims below should not be interpreted as only general or dictionary meanings, but interpreted as meanings and concepts satisfying the present disclosure based on a principle in that the inventor can appropriately define his/her disclosure with a concept of the terms in order to describe the disclosure in the best method.

Therefore, since embodiments described in the present specification and configurations shown in the drawings are merely exemplary embodiments of the present disclosure and do not represent all of the present disclosure, it should be understood that there may be various equivalents and modified examples that can replace the embodiments described in the present specification and the configurations shown in the drawings at the time of filing the present application.

Figure 2:
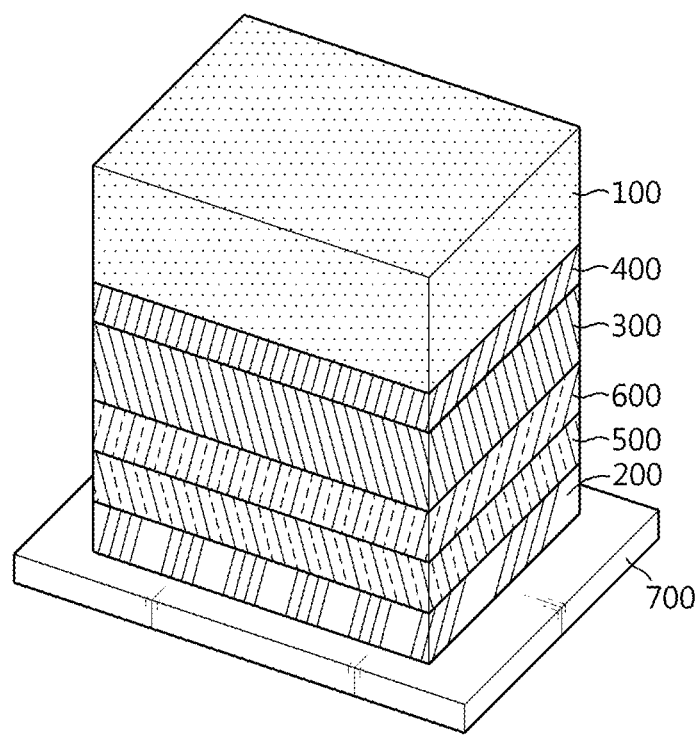
FIG. 2 is an enlarged view of a portion A of FIG. 1.

FIG. 1 schematically illustrates a thermoelectric module according to an embodiment of the present disclosure. FIG. 2 is an enlarged view of a portion A of FIG. 1.

Referring to FIGS. 1 and 2, a thermoelectric module according to an embodiment of the present disclosure may include a thermoelectric element 100, an electrode 200, and a bonding layer 300.

The thermoelectric element 100 may include a thermoelectric semiconductor and may also be referred to as a thermoelectric leg. The thermoelectric element 100 may include a p-type thermoelectric element 110 and an n-type thermoelectric element 120. Herein, the p-type thermoelectric element 110 may include a p-type thermoelectric semiconductor, that is, a p-type thermoelectric material in which a hole moves to transfer thermal energy. Herein, the n-type thermoelectric element 120 may include an n-type thermoelectric semiconductor, that is, an n-type thermoelectric material in which an electron moves to transfer thermal energy. One pair of p-n thermoelectric elements including the p-type thermoelectric element and the n-type thermoelectric element may be a basic unit of the thermoelectric element.

The p-type thermoelectric element 110 and the n-type thermoelectric element 120 may include various types of thermoelectric materials such as a chalcogenide family, a skutterudite family, a silicide family, a clathrate family, a half heusler family, and so forth. The p-type thermoelectric element and the n-type thermoelectric element may use a thermoelectric material of an identical family or thermoelectric materials of different families. The thermoelectric module according to the present disclosure may use various types of thermoelectric semiconductors well-known at the time of filing of the present application as the thermoelectric materials of the p-type thermoelectric element and the n-type thermoelectric element.

The p-type thermoelectric element and the n-type thermoelectric element may be manufactured by an operation of mixing base materials, an operation of synthesis based on thermal treatment, and a sintering operation. However, the present disclosure is not necessarily limited to such a specific thermoelectric element manufacturing scheme.

The thermoelectric module according to the present disclosure may include multiple p-type thermoelectric elements and multiple n-type thermoelectric elements as shown in FIG. 1. The multiple p-type thermoelectric elements and the multiple n-type thermoelectric elements may be configured such that thermoelectric elements of different types are alternately disposed and connected to each other.

The electrode 200 may include an electrically conductive material, for example, a metal material. The electrode 200 may include Cu, Al, Ni, Au, Ti, etc., or an alloy thereof. The electrode 200 may have a plate shape. For example, the electrode 200 may have a Cu plate shape. Moreover, the electrode 200 may have a rectangular plate shape in which one side is longer than the adjacent side to be easily bonded with thermoelectric elements at both ends of the electrode 200.

In particular, the electrode 200 may be provided between the p-type thermoelectric element and the n-type thermoelectric element to interconnect the p-type thermoelectric element and the n-type thermoelectric element. That is, one end of the electrode is bondedly connected to the p-type thermoelectric element, and the other end of the electrode is bondedly connected to the n-type thermoelectric element.

The multiple p-type thermoelectric elements and the multiple n-type thermoelectric elements may be included in the thermoelectric module, and thus the multiple electrodes may be included in the thermoelectric module.

The bonding layer 300 may be interposed between the thermoelectric element and the electrode to bond the thermoelectric element with the electrode. For example, referring to FIG. 2, the bonding layer 300 is disposed such that the thermoelectric element is positioned above the bonding layer 300 and the electrode is positioned below the bonding layer 300, thereby bonding a bottom portion of the thermoelectric element and an upper portion of the electrode to each other.

In particular, in the thermoelectric module according to the present disclosure, the bonding layer 300 may include a metal compound including metals of two or more classes. Herein, the metal compound may be a sintered body of a paste including metal powder of two or more classes. That is, the bonding layer 300 may include a material in which the metals of two or more classes included in the paste are transformed into the metal compound by sintering. Thus, the bonding layer 300 may consist of a dissimilar-metal paste bonding material.

Herein, the metal powder included in the paste before sintering for forming the bonding layer 300 may have a mean particle diameter of about 0.1 μm-about 20 μm. In this case, when the bonding layer 300 is formed by sintering the paste, reaction between the metals is facilitated, such that the metal compound may be easily formed to the extent greater than a specific one. In particular, the metal powder included in the paste may have a mean particle diameter of about 0.5 μm-about 10 μm.

Meanwhile, the paste forming the bonding layer 300 may further include an organic binder and a solvent. For example, the dissimilar-metal paste for forming the bonding layer 300 may be provided such that the metal powder of the metals of two or more classes are dispersed in a resin solution including the organic binder and the solvent. In particular, the resin solution of the dissimilar-metal paste may further include a flux for preventing oxidation of the metals in the paste and improving wettability. A content of the resin solution in the paste may be about 5 wt %-about 20 wt % with respect to a total weight of the paste.

The metals of two or more classes included in the bonding layer 300 may include a post-transition metal of one or more class and a transition metal of one or more class. That is, the bonding layer 300 may include a compound of the post-transition metal of one or more class and the transition metal of one or more class.

In particular, the metals of two or more classes may include Ni and Sn. That is, in the thermoelectric module according to the present disclosure, the bonding layer 300 includes Ni as the transition metal and Sn as the post-transition metal, thereby including the metal compound of Ni and Sn.

Herein, the bonding layer 300 may consist of a single phase of the metal compound or may include a mixture of the metal compound and elements of the metal compound.

For example, the bonding layer 300 may include only an Ni—Sn compound. Alternatively, the bonding layer 300 may include Ni and Sn together with the Ni—Sn compound. When the metal compound and the mono elements are mixed in this way, a total rate of the metal compound may be equal to or greater than 90% of the bonding layer 300 to stably secure the bonding strength of the bonding layer 300.

Preferably, if the bonding layer 300 includes the Ni—Sn compound, Ni and Sn may be included in the bonding layer 300 at a ratio of about (15-50):about (85-50) by wt %. When Ni and Sn are included in the bonding layer 300 at such a ratio, the bonding strength of the bonding layer 300 is secured stably while lowering specific resistance and increasing thermal conductivity.

In particular, in such a structure, Ni and Sn may be included in the bonding layer 300 at a ratio of about (20-40):about (80-60) by wt %. More preferably, Ni and Sn may be included in the bonding layer 300 at a ratio of about (25-35):about (75-65) by wt %.

The bonding layer 300 may further include additional metals other than the metal compound or metals of the metal compound.

For example, if the bonding layer includes the Ni—Sn compound, the bonding layer may further include at least one additional metal selected from among Fe, Cu, Al, Zn, Bi, Ag, Au, and Pt, other than Ni and Sn.

With this configuration according to the present disclosure, when the bonding layer is formed, these additional metals facilitate sintering between Ni and Sn, or improve properties of the bonding layer by reacting with Ni and Sn.

A rate of the additional metal may be equal to or less than 20 wt % of a total metal element of the bonding layer to secure the strength of the bonding layer. Preferably, the rate of the additional metal may be equal to or less than 10 wt % of the total metal element of the bonding layer.

In addition, preferably, the bonding layer may include a dissimilar-metal compound formed by sintering in a transient liquid phase sintering (TLPS) manner.

That is, the bonding layer may be formed in such a way that a TLPS paste including metal powders of two or more classes is sintered in the TLPS manner and the metal powders of two or more classes are transformed into a metal compound.

For example, the bonding layer may be formed by sintering of a paste including Ni powder, Sn powder, an organic binder, a solvent, and a flux in the TLPS manner. In this case, the bonding layer may include an Ni—Sn compound formed by TLPS sintering.

More specifically, in case of sintering in the TLPS manner, a part of an Ni element may be diffused out the Ni element where an Sn element exists, and the Sn element may be diffused in the Ni element. Through such diffusing, an Ni—Sn α phase may be formed. For example, through TLPS, $Ni_3Sn_4$ may be formed as an α phase.

The bonding layer may be formed by applying heat and pressure to a TLPS paste applied between the electrode and the thermoelectric element.

For example, the bonding layer may be formed by applying heat of about 300° C. or higher and pressure of about 0.1 MPa or higher to the TLPS paste. In particular, to form the bonding layer, heat of about 350° C. or higher, preferably, about 400° C. or higher, may be applied to the TLPS paste. The bonding layer may be formed by applying pressure of about 3 MPa-about 30 MPa, preferably, about 5 MPa-about 20 MPa to the TLPS paste.

The bonding layer may have a porosity of about 10% or lower to secure high bonding strength. In particular, the bonding layer may have a porosity of about 5% or lower.

In the thermoelectric module according to the present disclosure, the bonding strength of the bonding layer may be equal to or greater than 1 MPa. Preferably, the bonding strength of the bonding layer may be equal to or greater than 10 MPa.

Also, in the thermoelectric module according to the present disclosure, a specific resistance of the bonding layer may be equal to or less than about 100 μΩ·cm at a temperature of about 50° C. to secure stable thermoelectric performance. In particular, the specific resistance of the bonding layer may be equal to or less than about 65 μΩ·cm at a temperature of about 50° C.

Also, the specific resistance of the bonding layer may be equal to or less than about 125 µΩ·cm at a temperature of about 400° C. to secure stable thermoelectric performance at high temperatures. In particular, the specific resistance of the bonding layer may be equal to or less than about 90 µΩ·cm at a temperature of about 400° C.

Also, in the thermoelectric module according to the present disclosure, a thermal conductivity of the bonding layer may be equal to or greater than about 8 W/m·K at a temperature of about 50° C. to secure stable thermoelectric performance. In particular, the thermal conductivity of the bonding layer may be equal to or greater than about 13 W/m·K at a temperature of about 50° C.

Also, the thermal conductivity of the bonding layer may be equal to or greater than about 12 W/m·K at a temperature of about 400° C. to secure stable thermoelectric performance. In particular, the thermal conductivity of the bonding layer may be equal to or greater than about 16 W/m·K at a temperature of about 400° C.

Preferably, in the thermoelectric module according to the present disclosure, the thermoelectric element may include a skutterudite-based thermoelectric semiconductor.

For example, the n-type thermoelectric element and the p-type thermoelectric element may consist of a skutterudite-based thermoelectric material having a basic structure of $CoSb_3$.

With such a configuration according to the present disclosure, the bonding strength between the thermoelectric element and the bonding layer may be further improved. In particular, the bonding layer including the Ni—Sn compound may further improve the bonding strength with respect to the skutterudite-based thermoelectric material.

Preferably, the thermoelectric module according to the present disclosure may further include a metallized layer 400.

The metallized layer 400 may be interposed between the thermoelectric element and the bonding layer as shown in FIG. 2. The metallized layer 400 may consist of a metal, an alloy, or a metal compound. For example, the metallized layer 400 may include one or more selected from among Ti, Ni, NiP, TiN, Mo, Zr, ZrSb, Cu, Nb, W, MoTi, hastelloy, SUS, INCONEL, and MONEL.

With such a configuration according to the present disclosure, a bonding force between the thermoelectric element and the bonding layer may be reinforced by the metallized layer 400. Moreover, the metallized layer 400 may further enhance bonding property between a skutterudite-based thermoelectric element and an Ni—Sn bonding layer. Furthermore, with such a configuration according to the present disclosure, oxidation of a surface of the thermoelectric element may be prevented. In particular, the metallized layer 400 may effectively prevent oxidation of a surface of a skutterudite-based thermoelectric element. Moreover, with such a configuration according to the present disclosure, atom diffusion between the thermoelectric element and the bonding layer may be prevented. In particular, atom diffusion between a skutterudite-based thermoelectric element and an Ni—Sn bonding layer may be prevented by the metallized layer 400.

Figure 3:
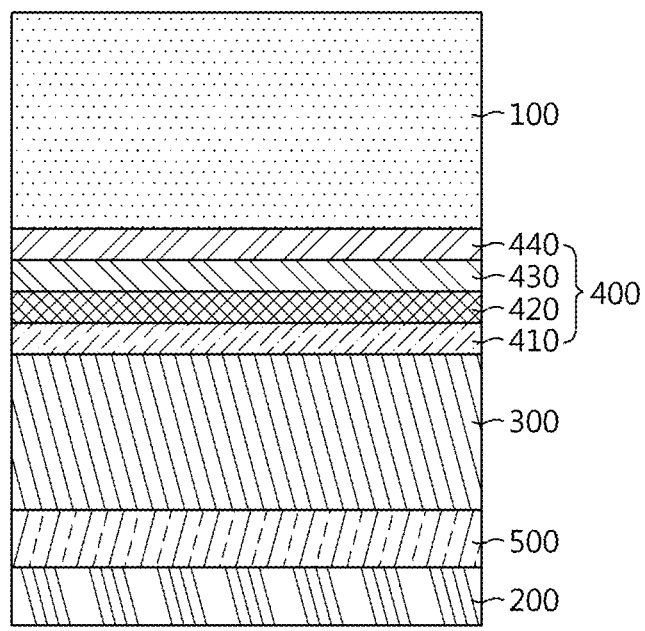
FIG. 3 schematically illustrates some elements of a thermoelectric module according to another embodiment of the present disclosure.

FIG. 3 schematically illustrates some elements of a thermoelectric module according to another embodiment of the present disclosure. Hereinbelow, parts that may be described in a similar manner to the embodiment of FIG. 2 will not be described in detail, and a description will focus on differences.

Referring to FIG. 3, between the bonding layer 300 and the thermoelectric element 100 is interposed the metallized layer 400 that includes two or more layers. In this case, each unit layer composing the metallized layer may include different materials. That is, the metallized layer may include stacking of two or more different layers.

For example, as shown in FIG. 3, the metallized layer may include four unit layers, i.e., a first unit layer 410, a second unit layer 420, a third unit layer 430, and a fourth unit layer 440. The unit layers may include different materials. For instance, the first unit layer may include NiP, the second unit layer may include Cu, the third unit layer may include Zr, and the fourth unit layer may include ZrSb.

With such a structure according to the present disclosure, the bonding strength of the bonding layer may be effectively improved.

Preferably, the thermoelectric module according to the present disclosure may further include a NiP layer 500. The NiP layer 500 includes NiP, and may be interposed between the electrode and the bonding layer as shown in FIG. 1.

With such a structure according to the present disclosure, the bonding strength between the electrode and the thermoelectric element by the bonding layer may be further improved. In particular, the NiP layer 500 enables the bonding strength between the bonding layer 300 and the electrode 200 to be secured stably.

Meanwhile, the thermoelectric module according to the present disclosure may further include an Au-plated layer 600.

For example, the Au-plated layer 600 is a plated layer including Au, and may be interposed between the bonding layer and the electrode as shown in FIG. 2. In particular, when the NiP layer is included in the thermoelectric module, the Au-plated layer 600 may be interposed between the bonding layer and the NiP layer.

Thus, in this case, between the thermoelectric element and the electrode therebelow, the metallized layer, the bonding layer, the Au-plated layer, and the NiP layer may be stacked sequentially from top to bottom.

With such a structure according to the present disclosure, the bonding property and the thermoelectric performance of the thermoelectric module may be further improved. In this case, oxidation of the electrode may be effectively prevented by the Au-plated layer.

The thermoelectric module according to the present disclosure may further include a substrate 700 as shown in FIG. 1.

The substrate 700 may include an electrically insulating material. For example, the substrate may include a ceramic material such as alumina, etc. However, the present disclosure is not limited to a specific material of the substrate 700. For instance, the substrate 700 may include various materials such as sapphire, silicon, SiN, SiC, AlSiC, quartz, and so forth.

The substrate 700 may be disposed outside the thermoelectric module to electrically insulate several elements of the thermoelectric module such as the electrode from the outside and to protect the thermoelectric module from an external physical or chemical factor. Also, the substrate 700 may have mounted the electrode, etc., thereon to keep a basic shape of the thermoelectric module. For example, as shown in FIG. 1, the substrate 700 may be provided both on an electrode coupled above the thermoelectric element 100 and under an electrode coupled below the thermoelectric element 100. In such a structure, the electrode 200 may be provided on a surface of the substrate 700 in various ways. For example, the electrode may be formed on a surface of the substrate 700 in various ways such as direct bonded copper (DBC), active metal brazing (AMB), etc. Alternatively, the electrode may be provided on the substrate through an adhesive, etc.

The thermoelectric module according to the present disclosure is applicable to various devices employing a thermoelectric technique. In particular, the thermoelectric module according to the present disclosure is applicable to a thermoelectric power-generation device. That is, the thermoelectric power-generation device according to the present disclosure may include the thermoelectric module according to the present disclosure.

The thermoelectric module according to the present disclosure may be manufactured and driven stably at high temperatures, and thus when applied to the thermoelectric power-generation device, may show stable performance.

Figure 4:
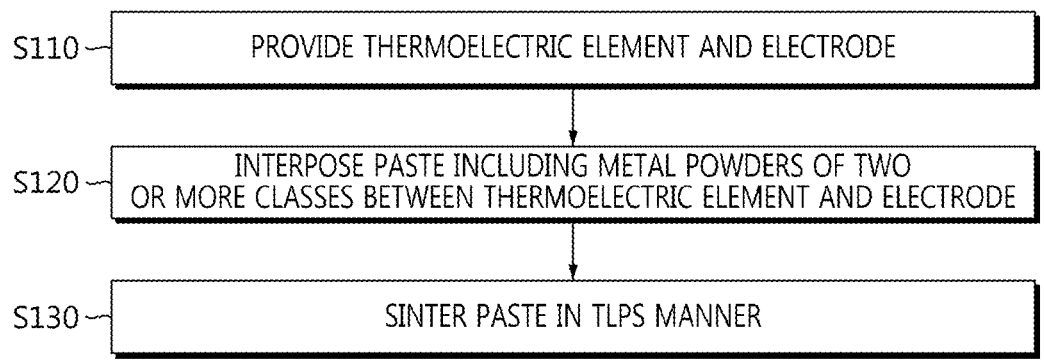
FIG. 4 is a flowchart of a method of manufacturing a thermoelectric module according to an embodiment of the present disclosure.

FIG. 4 is a flowchart of a method of manufacturing a thermoelectric module according to an embodiment of the present disclosure.

Referring to FIG. 4, in a method of manufacturing a thermoelectric module according to the present disclosure, a plurality of thermoelectric elements including a thermoelectric semiconductor and a plurality of electrodes including a metal material are provided first in operation S110. The thermoelectric element may have a bar shape, and the electrode may have a plate shape.

Next, a paste including metal powders of two or more classes is interposed between the thermoelectric element and the electrode in operation S120. For example, operation S120 may be performed by applying a paste including Ni powder and Sn powder onto an end of the electrode and placing the thermoelectric element on the paste. The paste may further include an organic binder and a solvent together with the metal powder. In particular, the paste in operation S120 may be formed in which the metal powders of two or more classes are dispersed in a resin solution including an organic binder, a solvent, and a flux.

The metal powder included in the paste in operation S120 may have a mean particle diameter of about 0.1 μm-about 20 μm. Preferably, the metal powder included in the paste in operation S120 may have a mean particle diameter of about 0.5 μm-about 10 μm.

Meanwhile, in operation S120, at least one metal selected from Fe, Cu, Al, Zn, Bi, Ag, Au, and Pt may be added to the paste.

Then, the paste is sintered in the TLPS manner in operation S130. In operation S130, the metal powders of two or more classes included in the paste in operation S120 may be transformed into a metal compound. For example, if Ni and Sn are included in the paste in operation S120, an Ni—Sn compound may be formed in operation S130.

In particular, operation S130 may be performed under a heat-application and pressure-application condition. For instance, operation S130 may be performed under a temperature condition of about 300° C. or higher, preferably, about 350° C. or higher, more preferably, about 400° C. or higher. Operation S130 may be performed under a pressure condition of about 0.1 MPa or higher, preferably, about 3 MPa-about 30 MPa, more preferably, about 5 MPa-about 20 MPa.

The method of manufacturing a thermoelectric module according to the present disclosure may further include an operation of forming a metallized layer between a bonding layer and a thermoelectric element.

The method of manufacturing a thermoelectric module according to the present disclosure may further include an operation of forming a NiP layer between the bonding layer and an electrode. In this case, the method of manufacturing a thermoelectric module according to the present disclosure may further include an operation of forming an Au-plated layer between the bonding layer and the NiP layer.

Hereinafter, embodiments and comparative examples will be described in detail to describe the present disclosure in more detail. However, the embodiments of the present disclosure may be modified into various forms, and it should not be construed that the scope of the present disclosure is limited to the embodiments described below. The embodiments of the present disclosure are provided to completely describe the present disclosure to those of average knowledge in the art.

EXAMPLE 1

As shown in FIG. 3, multiple unit thermoelectric modules in each of which a NiP layer, a bonding layer, and a metallized layer were sequentially disposed between a Cu electrode and a skutterudite-based thermoelectric element were manufactured as Example 1.

Herein, the bonding layer was formed by applying heat and pressure to a paste including 27.3 wt % of Ni powder having a mean particle diameter of 0.6 μm, 66.7 wt % of Sn powder having a mean particle diameter of 3.7 μm, 1.0 wt % of sodium stearate, and 5.0 wt % of dihydro terpineol. The heat-application and pressure-application were performed at 400° C. and 15 MPa for 0.5 hour.

The metallized layer consisted of four unit layers, i.e., a NiP layer, a Cu layer, a Zr layer, and a ZrSb layer that were disposed sequentially in a direction from the bonding layer to the thermoelectric element. The metallized layer was formed by stacking the Zr layer, the Cu layer, the NiP layer, etc., on the thermoelectric element in a sputtering manner before the bonding layer was formed.

EXAMPLE 2

Multiple unit thermoelectric modules in each of which a Cu electrode and a skutterudite-based thermoelectric element having the same materials and sizes as in Example 1 were used and a bonding layer and a metallized layer were sequentially interposed between the Cu electrode and the thermoelectric element were manufactured as Example 2.

In this case, the bonding layer used a paste having composition that was different from that of the bonding layer of Example 1. That is, the paste used to form the bonding layer of Example 2 included 29.5 wt % of Ni powder having a mean particle diameter of 2 μm-3 μm, 55.7 wt % of Sn powder having a mean particle diameter of 10 μm, 10.3 wt % of ethyl cellulose, and 4.5 wt % of terpineol. The heat-application and pressure-application for forming the bonding layer were performed at 450° C. and 5 MPa for 1 hour.

The metallized layer consisted of one unit layer, i.e., a NiP layer.

EXAMPLE 3

Multiple unit thermoelectric modules in each of which the Cu electrode and the skutterudite-based thermoelectric element having the same materials and sizes as in Example 1 were used and a NiP layer, a bonding layer and a metallized layer were sequentially interposed between the Cu electrode and the thermoelectric element were manufactured as Example 3.

In this case, the bonding layer used a paste having composition that was different from that of the bonding layer of Example 1. That is, the paste used to form the bonding layer of Example 3 included 26.6 wt % of Ni powder having a mean particle diameter of 2 μm-3 μm, 62.2 wt % of Sn powder having a mean particle diameter of 1 μm, 1.4 wt % of butyl methacrylate, and 9.8 wt % of dihydro terpineol. The heat-application and pressure-application for forming the bonding layer were performed at 400° C. and 15 MPa for 0.5 hour. The metallized layer consisted of two unit layers, i.e., a NiP layer and a Ti layer.

EXAMPLE 4

Multiple unit thermoelectric modules in each of which a Cu electrode and a skutterudite-based thermoelectric element having the same materials and sizes as in Example 1 were used and only a bonding layer was interposed between the Cu electrode and the thermoelectric element were manufactured as Example 4.

In this case, the bonding layer used a paste having composition that was different from that of the bonding layer of Example 1. That is, the paste used to form the bonding layer of Example 4 included 29.3 wt % of Ni powder having a mean particle diameter of 3 μm, 54.7 wt % of Sn powder having a mean particle diameter of 10 μm, 11.8 wt % of polyvinyl butyral, and 4.2 wt % of dihydro terpineol. The heat-application and pressure-application for forming the bonding layer were performed at 450° C. and 15 MPa for 1 hour.

FIGS. 5 through 8 show pictures of cross-sectional layer shapes of a bonding structure between thermoelectric elements and an electrode according to Examples 1 through 4 of the present disclosure.

Figure 5:
FIGS. 5 through 8 show pictures of cross-sectional layer shapes of a bonding structure between thermoelectric elements and an electrode according to Embodiments 1 through 4 of the present disclosure.

Referring to FIG. 5, it was verified that multiple layers were stacked between an electrode and a thermoelectric element and each layer was a NiP layer, a bonding layer, a NiP layer, a Cu layer, a Zr layer, and a ZrSb layer.

Figure 6:
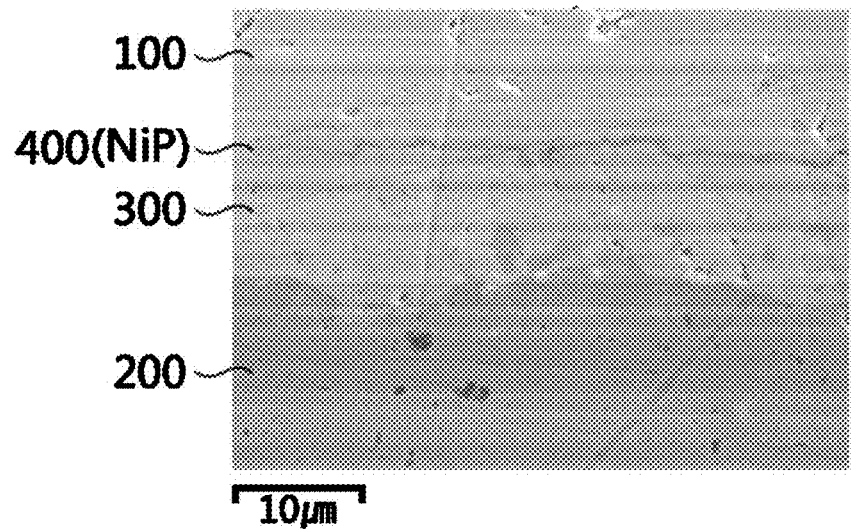

Next, referring to FIG. 6, it was verified that a bonding layer and a NiP layer were sequentially stacked between the electrode and the thermoelectric element.

Figure 7:
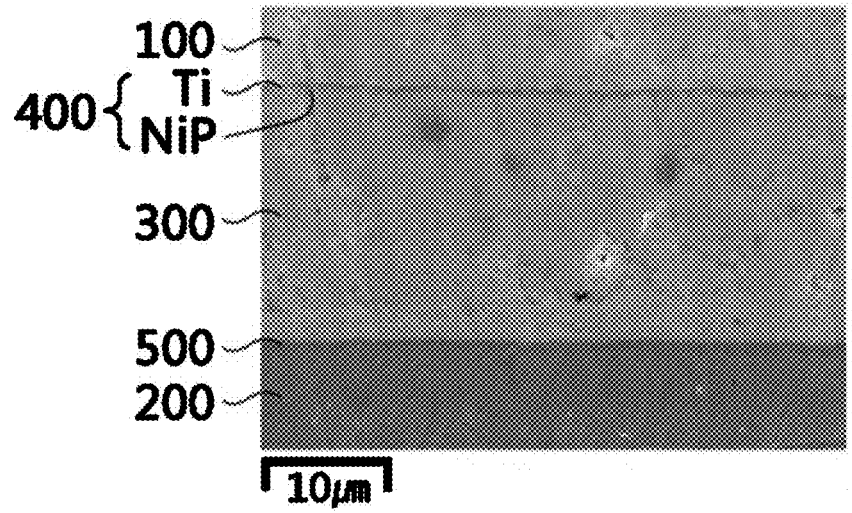

Referring to FIG. 7, it was verified that a NiP layer, a bonding layer, a NiP layer, and a Ti layer were stacked between the electrode and the thermoelectric element.

Figure 8:
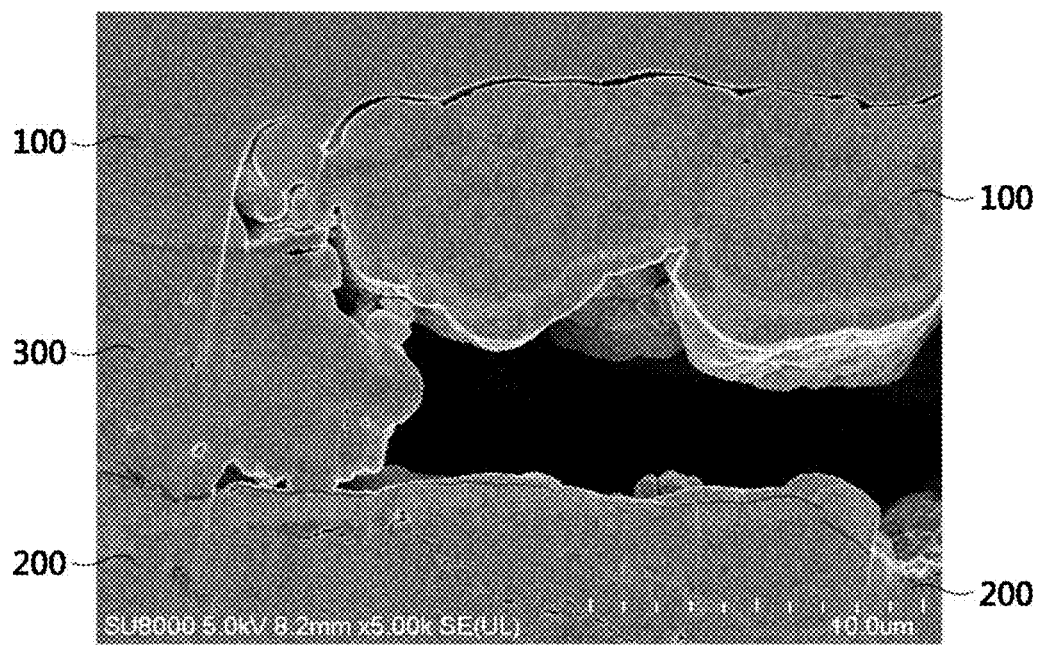
Figure 9:
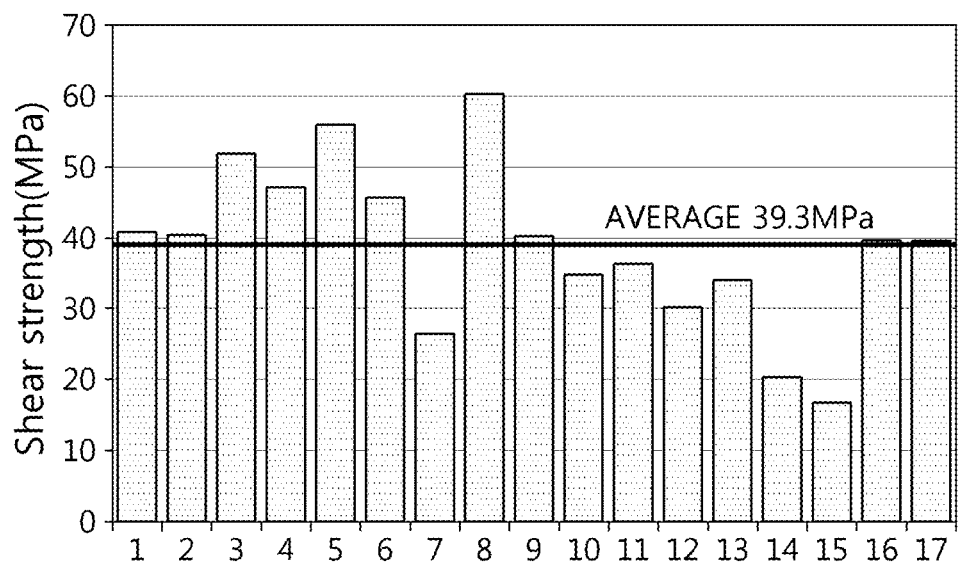
FIGS. 9 through 12 show graphs of bonding strength measurement results according to the first through fourth embodiments of the present disclosure.
Figure 10:
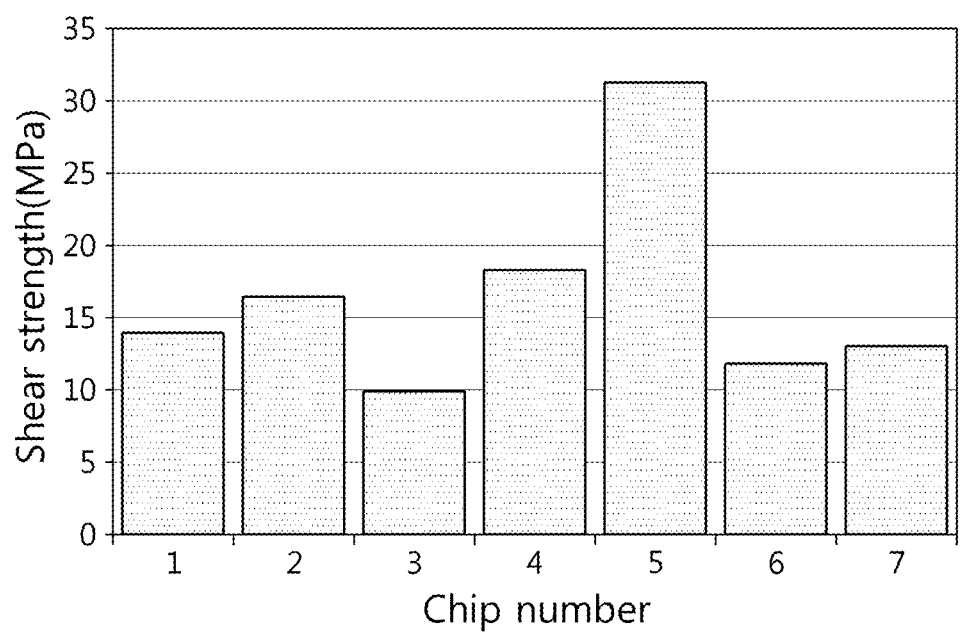
Figure 11:
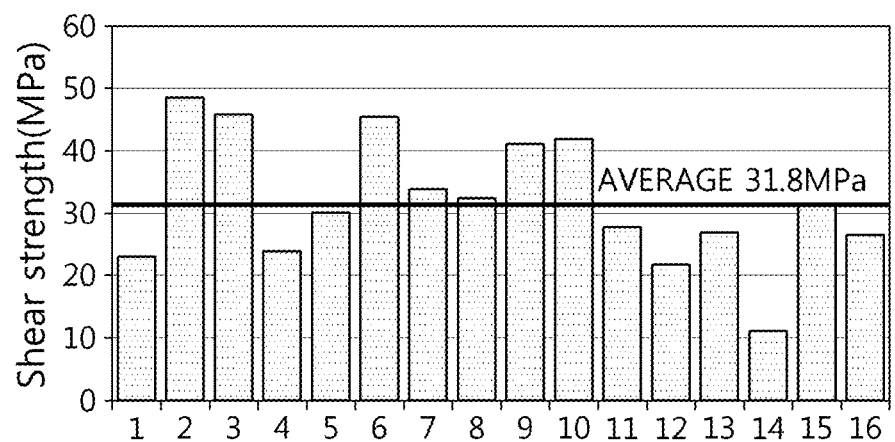
Figure 12:
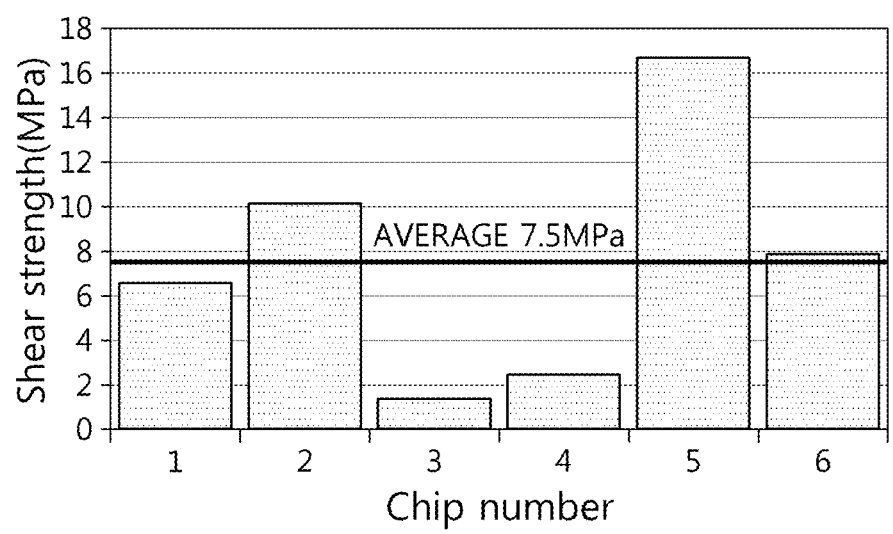

Referring to FIG. 8, it was verified that a bonding layer was interposed between the electrode and the thermoelectric element.

Moreover, when compared to the embodiment of FIG. 8, in the embodiments of FIGS. 5 through 7, an empty space was not generated in a portion where the bonding layer existed, which may be due to the metallized layer 400 and/or the NiP layer 500. Also, when the empty space was not generated in the portion where the bonding layer existed in this way, bonding strength between the electrode and the thermoelectric element was predicted to be stably secured.

The following measurement results were obtained by measuring a specific resistance of the bonding layer in Embodiments 1 and 3 using equipment LSR-3 of Linseis.
  Example 1: 62 μΩ·cm (50° C.), 85 μΩ·cm (400° C.)
  Example 3: 57 μΩ·cm (50° C.), 88 μΩ·cm (400° C.)

The following measurement results were obtained by measuring a thermal conductivity of the bonding layer in Embodiments 1 and 3 using equipment LFA457 of Netzsch.
  Example 1: 13 W/m·K (50° C.), 17 W/m·K (400° C.)
  Example 3: 13 W/m·K (50° C.), 16 W/m·K (400° C.)

The following measurement results were obtained by measuring a porosity in Embodiments 1 through 4 using "analyze particles" method of an image analysis program (ImageJ).

Example 1: Less than 1%
  Example 2: Less than 5%
  Example 3: Less than 5%
  Example 4: Less than 40%

For Examples 1 through 4, using a bonding force testing apparatus (Bondtester, Nordson DAGE 4000), a shear force was applied to a thermoelectric element to measure a shear strength at a moment when the element was broken away from the electrode, and results of the measurement were shown in FIGS. 9 through 12. That is, FIGS. 9 through 12 show graphs of bonding strength measurement results of bonding layer according to the Examples 1 through 4 of the present disclosure. In FIGS. 9 through 12, an x axis indicates a sample number and a y axis indicates a shear strength.

Referring to FIGS. 9 through 12, it can be seen that a thermoelectric module including a bonding layer according to several embodiments of the present disclosure has high bonding strength. Moreover, in Examples 1 through 3, a bonding strength is equal to or greater than 10 MPa, which is higher than in Example 4.

Referring to results of FIGS. 5 through 8, in Example 4, an empty space exists between an electrode and a thermoelectric element; whereas in Examples 1 through 3, an empty space does not exist between an electrode and a thermoelectric element, and thus such a bonding strength improvement effect may be predicted to be obtained.

Particularly in Embodiment 1, an average bonding strength of 17 samples was measured as 39.3 MPa. This is a very high strength as a bonding strength of a bonding layer of a thermoelectric module. Moreover, also in Example 3, an average bonding strength of 16 samples was measured as a quite high value of 31.8 MPa.

Thus, it can be seen from results of such measurement that the thermoelectric module according to the present disclosure has high bonding strength between the thermoelectric element and the electrode.

Meanwhile, for comparison with the embodiments of the present disclosure, a thermoelectric module in which an electrode and a thermoelectric element are bonded according to related art is manufactured as described below.

COMPARATIVE EXAMPLE 1

Multiple unit thermoelectric modules, in each of which a Cu electrode and a skutterudite-based thermoelectric element having the same materials and sizes as in Example 1 were used and a bonding layer was interposed between the Cu electrode and the thermoelectric element, were manufactured as Comparative Example 1.

Herein, as the bonding layer, a currently commercialized Ag paste (mAgic Paste ASP016/043, pressure assisted) of Heraeus was used. The heat-application and pressure-application for forming the bonding layer were performed at 300° C. and 15 MPa for 0.5 hour.

The metallized layer consisted of one unit layer, i.e., an Ag layer.

COMPARATIVE EXAMPLE 2

Multiple unit thermoelectric modules in each of which a Cu electrode and a skutterudite-based thermoelectric element having the same materials and sizes as in Example 1 were used and a bonding layer was interposed between the Cu electrode and the thermoelectric element were manufactured as Comparative Example 2.

Herein, as the bonding layer, a currently commercialized lead-free solder paste (LOCTITE MULTICORE HF 200, 97SC(SAC305)) of Henkel was used. To form the bonding layer, reflow was performed at 250° C. for 2 minutes.

The metallized layer consisted of one unit layer, i.e., a NiP layer.

Figure 13:
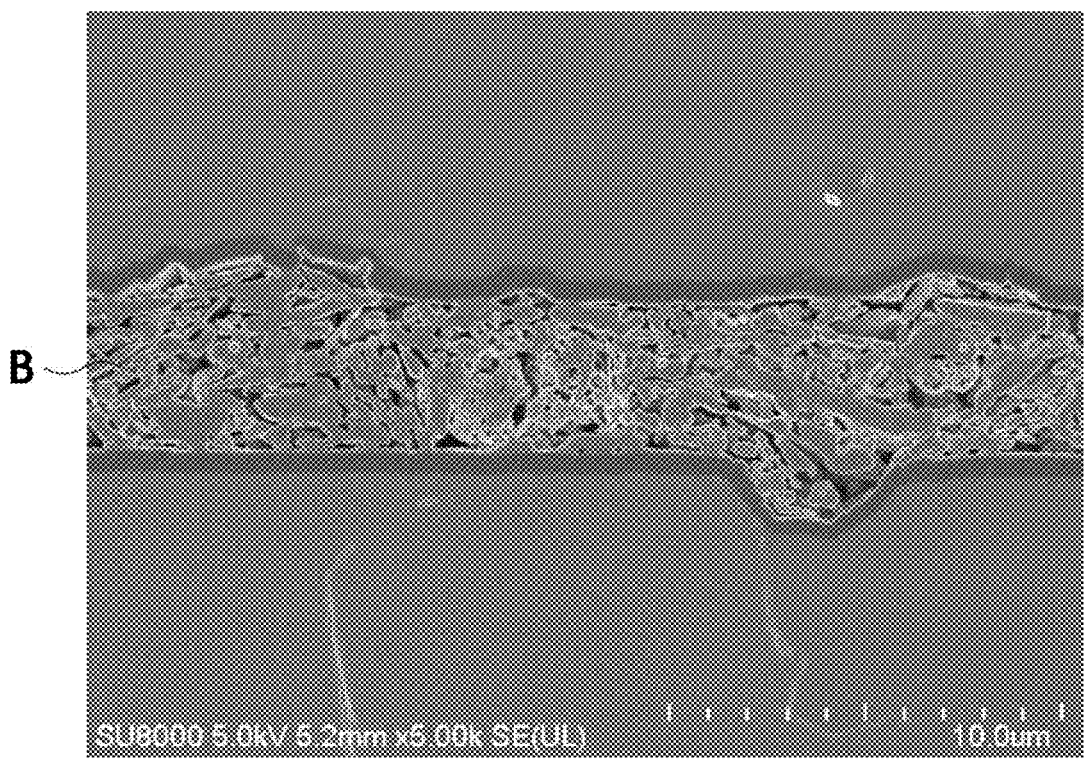
FIG. 13 shows a captured cross-sectional layer shape image of a bonding structure between thermoelectric elements and an electrode of a thermoelectric module according to Comparative Example 1.
Figure 14:
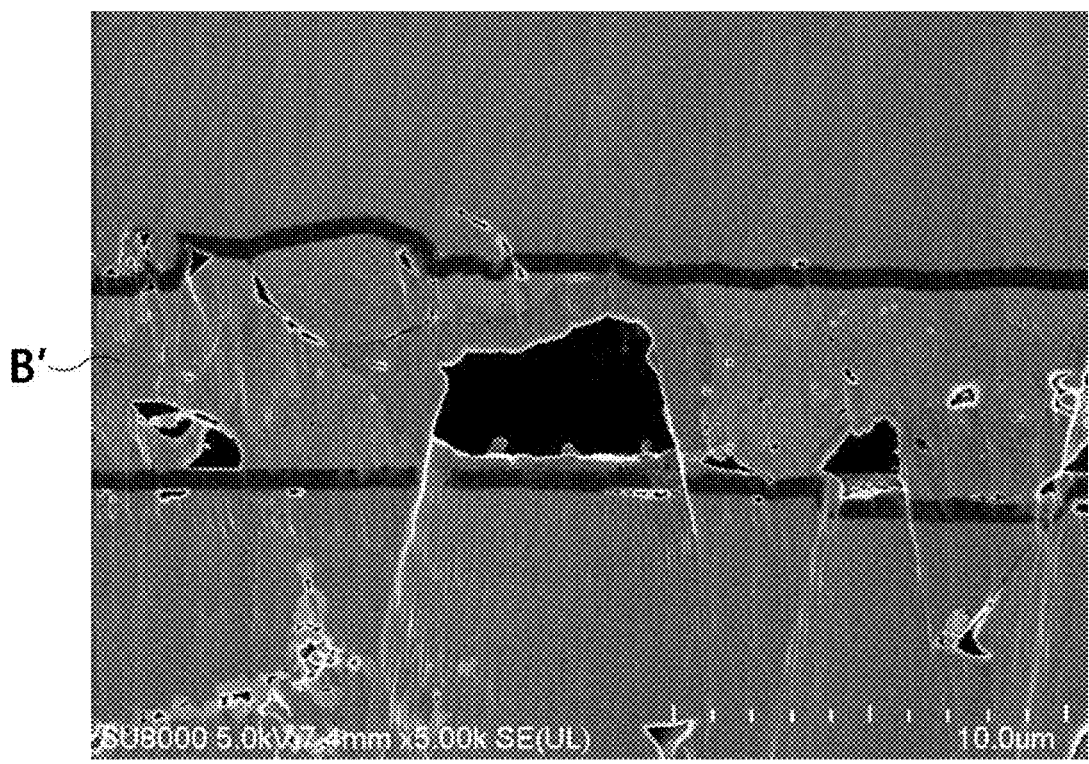
FIG. 14 shows a capture cross-sectional layer shape image after annealing performed with respect to Comparative Example 1 of FIG. 13 for a predetermined time.

FIG. 13 shows a captured cross-sectional layer shape image of a bonding structure between thermoelectric elements and an electrode of a thermoelectric module according to Comparative Example 1. The thermoelectric module according to Comparative Example 1 is then annealed at 500° C. for 15 hours under a vacuum degree of $10^{-3}$ torr. The result is shown in FIG. 14.

First, referring to FIG. 13, it can be seen that between an electrode and a thermoelectric element, an Ag paste layer is interposed as indicated by B. However, referring to FIG. 14, it can be seen that a big pore is formed in a portion of the Ag paste layer as indicated by B'.

Thus, from the result, it can be seen that when the electrode and the thermoelectric element are bonded using an Ag sinter paste, a pore is formed in a high-temperature state, degrading bonding property. Such a pore is predicted to be formed by migration and growth of a void in the paste at a high temperature. Thus, a bonding layer of a conventional thermoelectric module according to Comparative Example 1 may be difficult to secure high-temperature reliability.

Figure 15:
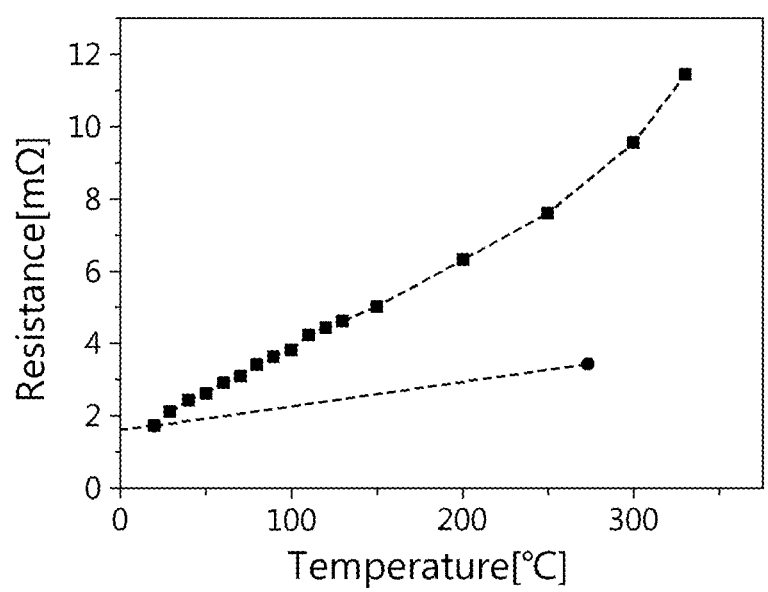
FIG. 15 shows a graph of a resistance measurement result of a solder bonding layer with respect to a temperature of a thermoelectric module according to Comparative Example 2.

Next, for a thermoelectric module according to Comparative Example 2, a resistance of a solder bonding layer with respect to a temperature is measured and a result is shown in FIG. 15.

Referring to FIG. 15, as a temperature increases, the resistance increases, and sharply increases over a specific temperature. It may be predicted that as the temperature reaches a melting point of a solder of the bonding layer, interconnection is weakened and thus the resistance sharply increases. Moreover, referring to FIG. 15, the resistance is not measured any longer at near about 330° C., and this is because the bonding layer by soldering melts and thus measurement is not possible any longer.

As such, from the measurement results of the several embodiments and comparative examples, it can be seen that in the thermoelectric module according to the present disclosure, the bonding strength of the bonding layer is high and is maintained stably even at high temperatures.

Although the present disclosure has been described with reference to limited embodiments and drawings, the present disclosure is not limited thereto, and it would be obvious that various modifications and changes may be made by those of ordinary skill in the art without departing from the disclosure of the present disclosure and a scope equivalent to the appended claims.

What is claimed is:

1. A thermoelectric module comprising:
   a plurality of thermoelectric elements comprising a thermoelectric semiconductor;
   an electrode which comprises a metal material and is connected between thermoelectric elements; and
   a bonding layer which is interposed between the thermoelectric element and the electrode to bond thermoelectric elements with the electrode and comprises a metal compound comprising at least 80% by weight of Ni and Sn as a sintered body of a paste,
   wherein Ni and Sn are included in the bonding layer at a ratio of (15–50):(85–50), and
   wherein the sintered body has a porosity, and the porosity is 5% or less,
   wherein the metal compound is formed at a temperature of about 300° C. or higher, and
   wherein the only metal particles in the paste are Ni particles and Sn particles.

2. The thermoelectric module of claim 1, wherein the bonding layer is formed in such a way that a paste comprising the metal powders of two or more classes is sintered in a transient liquid phase sintering (TLPS) manner and the metal powders of two or more classes are transformed into the metal compound.

3. The thermoelectric module of claim 1, wherein the thermoelectric element comprises a skutterudite-based thermoelectric semiconductor.

4. The thermoelectric module of claim 1, further comprising a metallized layer which comprises metal, an alloy, or a metal compound and is interposed between the thermoelectric element and the bonding layer.

5. The thermoelectric module of claim 4, wherein the metallized layer is formed by stacking of two or more different layers.

6. The thermoelectric module of claim 1, further comprising a NiP layer between the bonding layer and the electrode.

7. A thermoelectric power-generation device comprising the thermoelectric module according to claim 1.

8. A method of manufacturing a thermoelectric module, the method comprising:
   providing a plurality of thermoelectric elements comprising a thermoelectric semiconductor and a plurality of electrodes comprising a metal material;
   interposing a paste comprising at least 80% by weight of Sn and Ni between the thermoelectric element and the electrode, wherein Ni particles and Sn particles are included in the bonding layer at a ratio of (15–50):(85–50); and
   sintering the paste in a transient liquid phase sintering (TLPS) manner at a temperature of about 300° C. or higher,
   wherein the sintered body has a porosity, and the porosity is 5% or less.

9. The thermoelectric module of claim 1, wherein the bonding layer comprises at least 90% by weight of Ni and Sn.

10. The thermoelectric module of claim 1, wherein Ni and Sn are included in the bonding layer at a ratio of (20–40):(80–60).

11. The thermoelectric module of claim 1, wherein Ni and Sn are included in the bonding layer at a ratio of (25–35):(75–65).

12. The thermoelectric module of claim 1, wherein a shear strength of the bonding layer is from 10 MPa to 60 MPa.

13. The method of claim 8, wherein a shear strength of the bonding layer is from 10 MPa to 60 MPa.

* * * * *